(12) United States Patent
Hiyamizu

(10) Patent No.: US 11,749,355 B2
(45) Date of Patent: Sep. 5, 2023

(54) SEMICONDUCTOR INTEGRATED CIRCUITS, MULTI-CHIP PACKAGE, AND OPERATION METHOD OF SEMICONDUCTOR INTEGRATED CIRCUITS

(71) Applicant: Kioxia Corporation, Tokyo (JP)

(72) Inventor: Daisaku Hiyamizu, Machida Tokyo (JP)

(73) Assignee: Kioxia Corporation, Tokyo (JP)

( * ) Notice: Subject to any disclaimer, the term of this patent is extended or adjusted under 35 U.S.C. 154(b) by 224 days.

(21) Appl. No.: 17/394,577

(22) Filed: Aug. 5, 2021

(65) Prior Publication Data
US 2022/0301635 A1 Sep. 22, 2022

(30) Foreign Application Priority Data
Mar. 18, 2021 (JP) ................. 2021-044422

(51) Int. Cl.
*G11C 5/06* (2006.01)
*G11C 16/26* (2006.01)
*H01L 25/065* (2023.01)
*G11C 16/20* (2006.01)
*H01L 23/31* (2006.01)

(52) U.S. Cl.
CPC .............. *G11C 16/26* (2013.01); *G11C 16/20* (2013.01); *H01L 23/31* (2013.01); *H01L 25/0657* (2013.01); *H01L 2924/1443* (2013.01)

(58) Field of Classification Search
CPC ....... G11C 5/063; G11C 7/18; G11C 11/4097; G11C 5/025; G11C 5/04

USPC .......................................................... 365/63
See application file for complete search history.

(56) References Cited

U.S. PATENT DOCUMENTS

| 4,912,636 A | 3/1990 | Magar et al. |
| 2001/0046167 A1* | 11/2001 | Ayukawa ............ G11C 11/4076 365/200 |
| 2015/0131397 A1 | 5/2015 | Takeyama et al. |
| 2018/0300275 A1 | 10/2018 | Wu et al. |

FOREIGN PATENT DOCUMENTS

| JP | H07302251 A | 11/1995 |
| JP | 6067541 B2 | 1/2017 |
| JP | 6745289 B2 | 8/2020 |

* cited by examiner

*Primary Examiner* — Son T Dinh
(74) *Attorney, Agent, or Firm* — Holtz, Holtz & Volek PC

(57) ABSTRACT

According to a certain embodiment, the semiconductor integrated circuit includes a multi-chip package comprising a plurality of memory chips, and a controller configured to control the multi-chip package. Each of the plurality of memory chips includes a logic control unit including a logic unit circuit configured to detect a potential from a wiring pad. The logic unit circuit determines a master chip or a slave chip on the basis of the potential detected from the wiring pad, the master chip transmits a pulse count and a status response command to the slave chip, so that the slave chip sets a logical unit number of its own memory chip, and the master chip sets a total number of chips loaded on the basis of status information from the slave chip.

20 Claims, 15 Drawing Sheets

FIG. 5

| MEMORY CHIP | PD2 | PD1 |
|---|---|---|
| #0 | 0 | 0 |
| #1 | 0 | 1 |
| #2 | 1 | 0 |
| #3 | 1 | 1 |

FIG. 6

| No. | OUTPUT VALUES | | |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

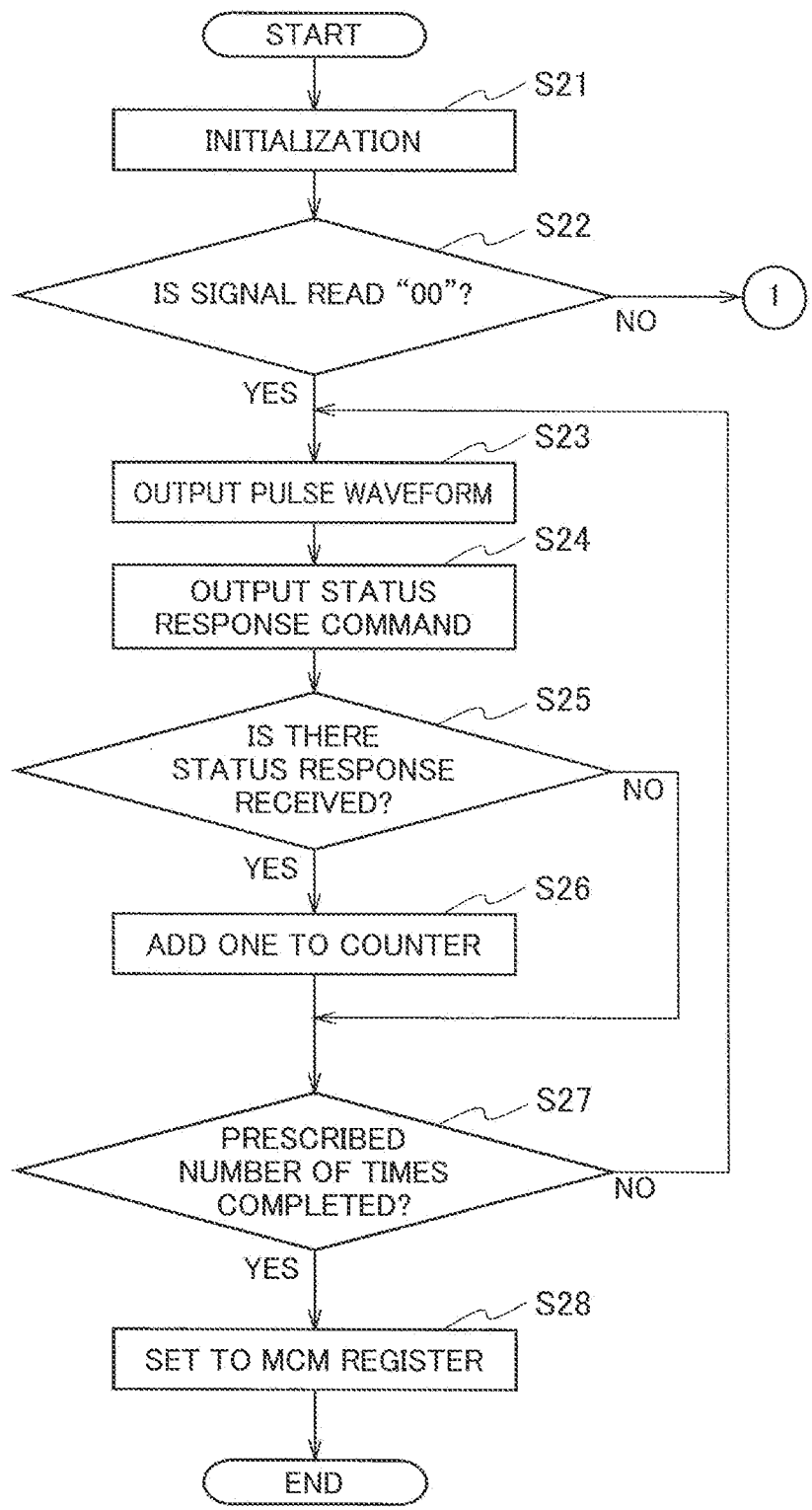

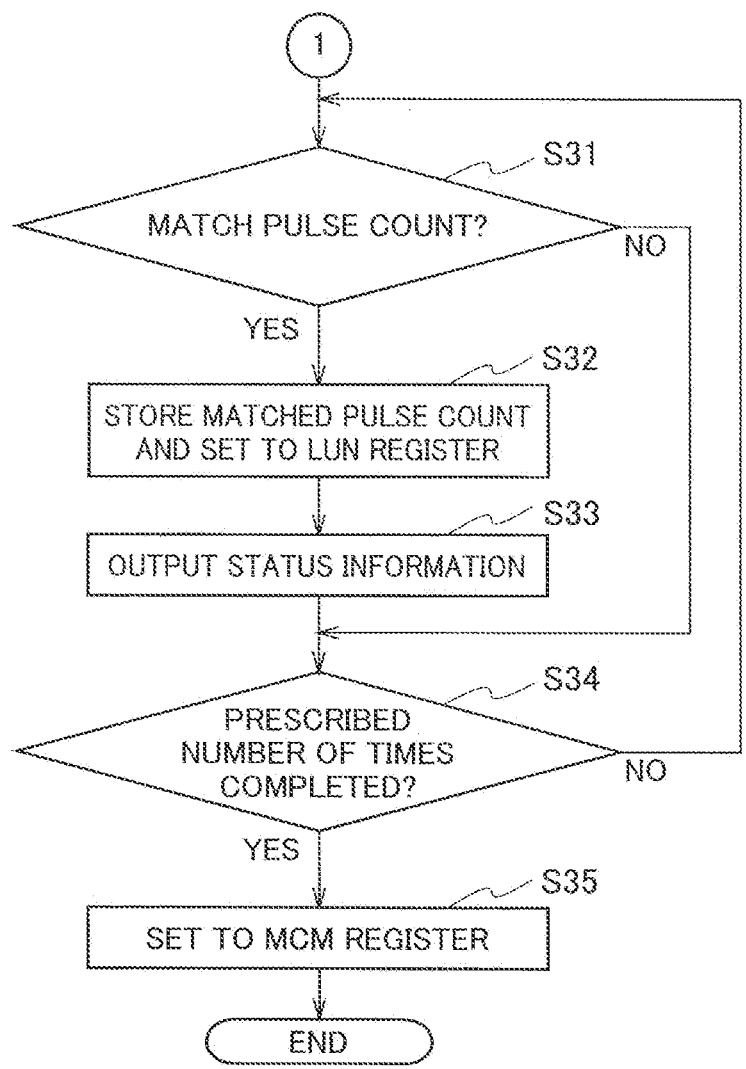

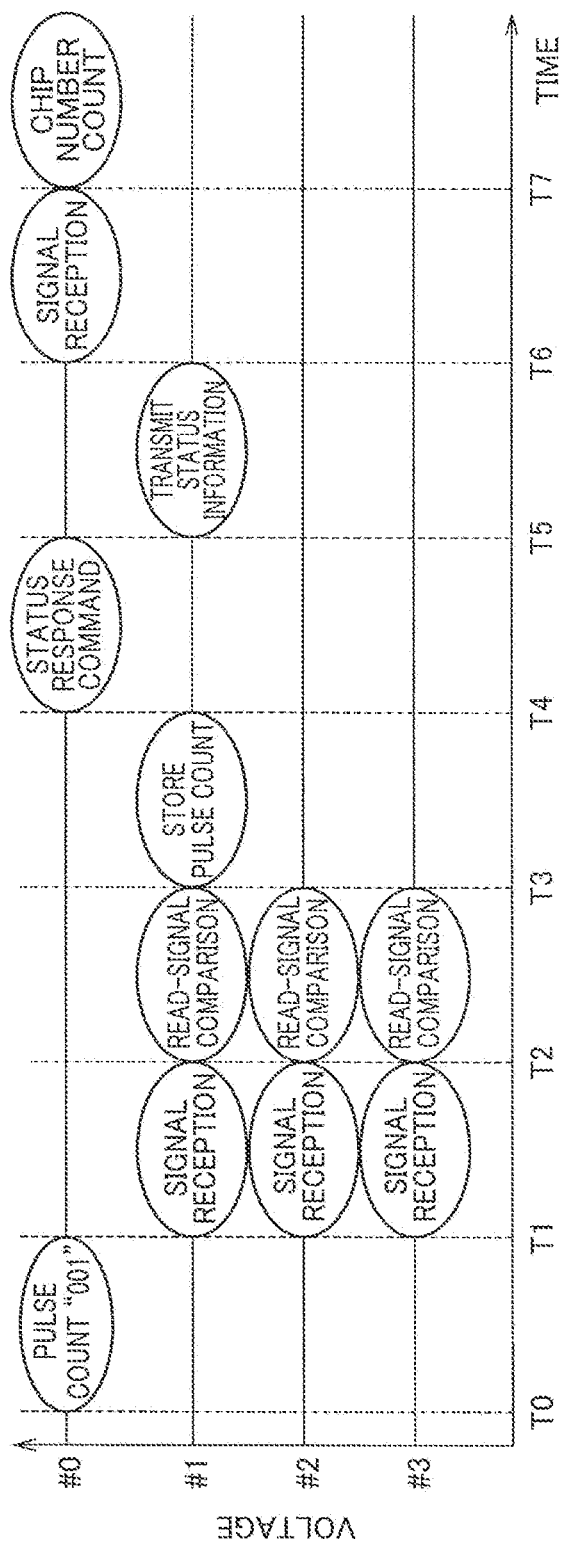

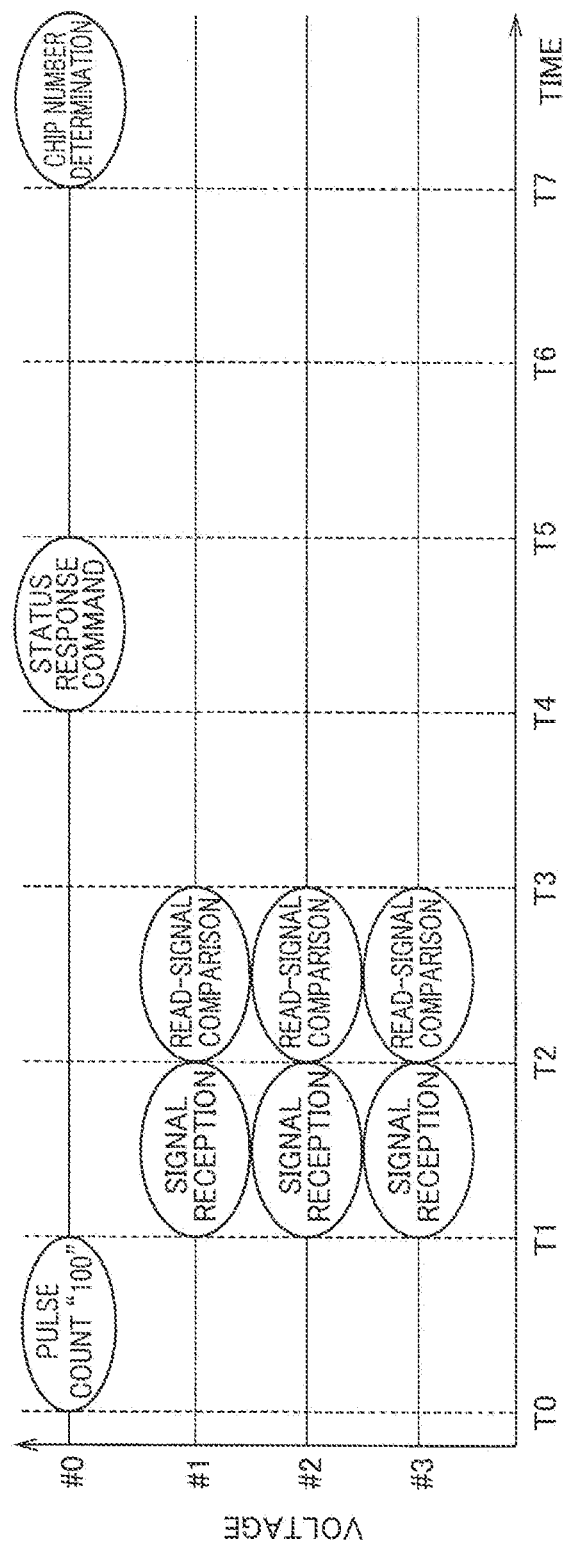

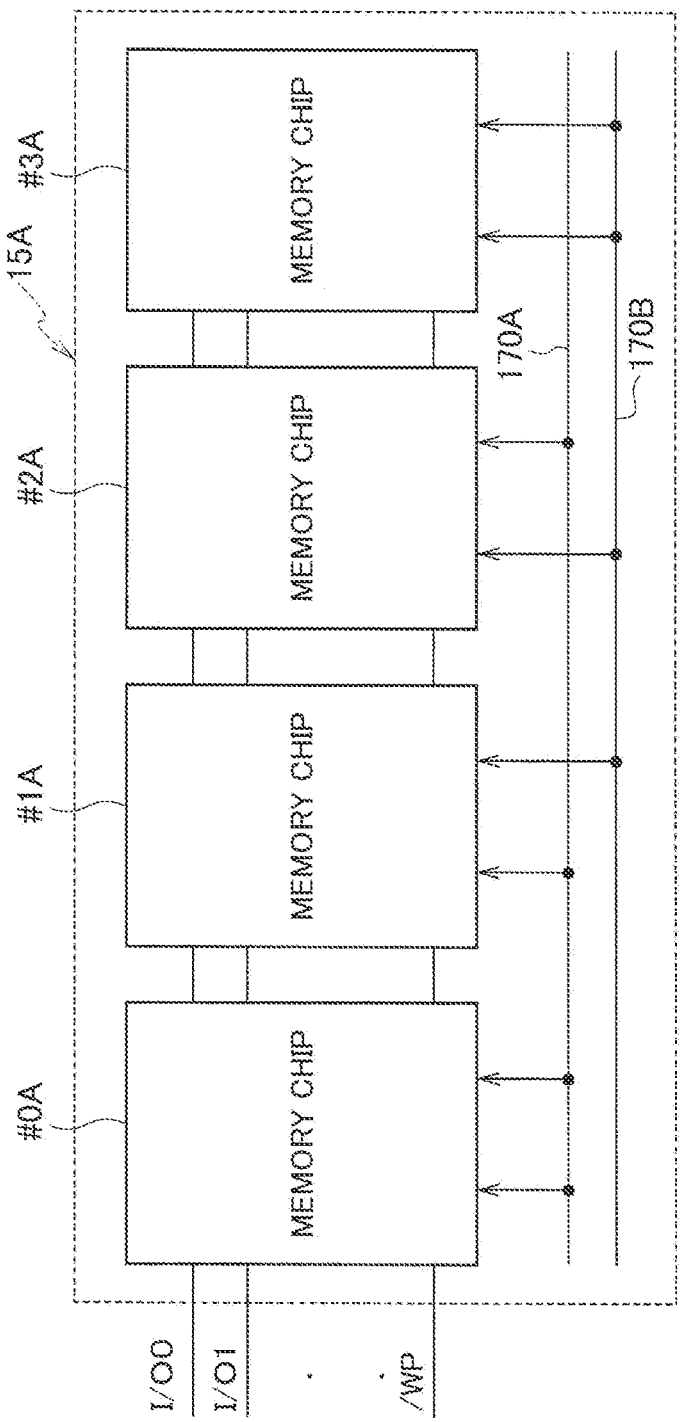

SEMICONDUCTOR INTEGRATED CIRCUITS, MULTI-CHIP PACKAGE, AND OPERATION METHOD OF SEMICONDUCTOR INTEGRATED CIRCUITS

CROSS REFERENCE TO RELATED APPLICATIONS

This application is based upon and claims the benefit of priority from prior Japanese Patent Application No. P2021-044422 filed on Mar. 18, 2021, the entire contents of which are incorporated herein by reference.

FIELD

Embodiments described herein relate generally to a semiconductor integrated circuit, a multi-chip package, and an operation method of the semiconductor integrated circuit.

BACKGROUND

A NAND flash memory is known as a nonvolatile semiconductor memory device. It is known that, when a NAND flash memory is configured with a plurality of memory chips, each memory chip is recognized by rewriting a register stored in a ROM area of a memory cell array from the outside after a package is sealed.

BRIEF DESCRIPTION OF THE DRAWINGS

FIG. 4 is a flowchart illustrating an initialization operation procedure of the memory chip after the power is turned on.

FIG. 5 is a diagram illustrating an example of a table of read values for memory chips due to connection of bonding pads of each memory chip illustrated in FIG. 3.

FIG. 6 is a diagram illustrating an example of a table of output values by an encoder circuit of a logic unit, circuit.

FIG. 7A is a flowchart of an operation by a master chip MC in LUN and MCM settings.

FIG. 7B is a flowchart of an operation by a slave chip SC in LUN and MCM settings.

FIG. 8A is a timing chart diagram illustrating a response sequence with a pulse count "001" and a status response command.

FIG. 8D is a timing chart diagram illustrating a response sequence with a pulse count "100" and a status response command.

FIG. 9 is a block diagram illustrating an example of an internal structure of a memory package according to a modification of the embodiment.

DETAILED DESCRIPTION

Certain embodiments will now be described with reference to drawings. In the description of the following drawings to be explained, the identical or similar reference sign is attached to the identical or similar part. However, it should be noted that the drawings are schematic.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

In the following description, a logical unit number LUN (Logical Unit Number) and a multi-chip module MCM (Multi-Chip Module) may be abbreviated to LUN and MCM.

Certain embodiments disclosed herein provide a semiconductor integrated circuit in which on the basis of electric signals detected by a plurality of memory chips in a multi-chip package, each memory chip can recognize the logical unit number of its own memory chip and the total number of chips loaded.

According to one embodiment, the semiconductor integrated circuit includes a multi-chip package comprising a plurality of memory chips, and a controller configured to control the multi-chip package. Each of the plurality of memory chips includes a logic control unit including a logic unit, circuit configured to detect a potential from a wiring pad. The logic unit circuit determines a master chip or a slave chip on the basis of the potential detected, from the wiring pad, the master chip transmits a pulse count and a status response command to the slave chip, so that the slave chip sets a logical unit number of its own memory chip, and the master chip sets a total number of chips leaded on the basis of status information from the slave chip.

Embodiments (Semiconductor Integrated Circuit)

Figure 1:
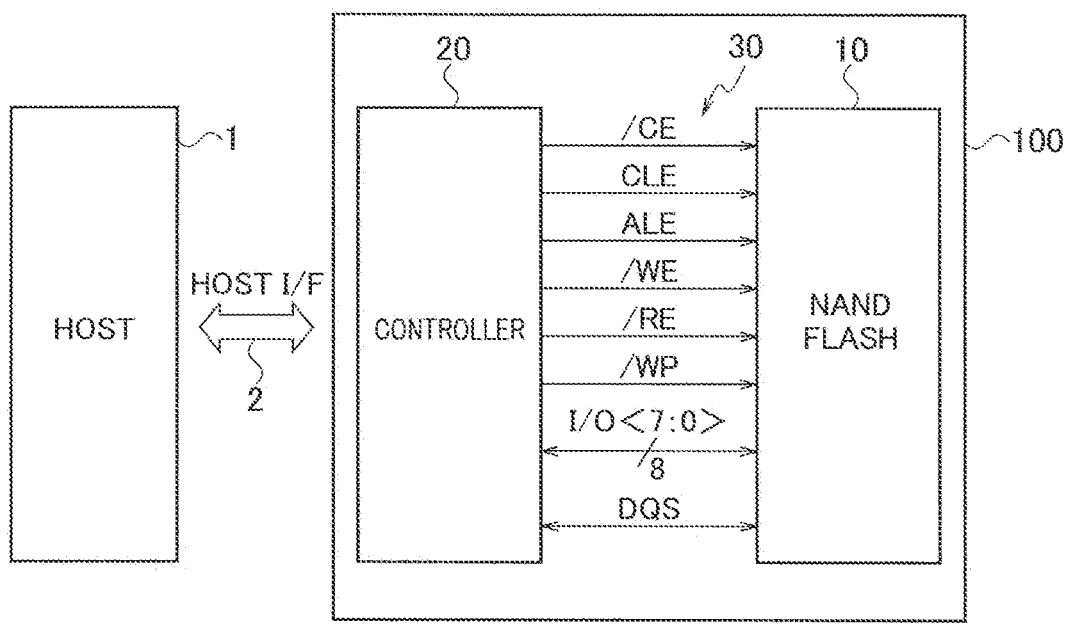
FIG. 1 is a block diagram illustrating an example of a configuration of a semiconductor integrated circuit according to an embodiment.

An example of a block configuration of a semiconductor integrated circuit 100 according to an embodiment is represented as illustrated in FIG. 1. The semiconductor integrated circuit 100 is connected to a host device 1 via a host interface 2 and functions as an external storage device of the host device 1. The host device 1 is, for example, a personal computer, a tablet, a smartphone, a mobile phone, an imaging device, or the like. In the following description, the host device 1 is also referred to as a host 1. The host interface 2 is also referred to as a host I/F2.

As illustrated in FIG. 1, the semiconductor integrated circuit 100 includes a nonvolatile semiconductor memory device 10, a controller 20, and a NANO interface 30. The nonvolatile semiconductor memory device 10 is a HAND flash, for example. The nonvolatile memory is not limited to a nonvolatile semiconductor memory, such as a NAND flash, and may foe any memory capable of storing data, such as a ReRAM (Resistance Random Memory) or an FeRAM (Ferroelectric Random Memory). In the following description, the nonvolatile semiconductor memory device 10 is referred to as a NAND flash 10 as an example. The NAND interface 30 is referred to as a NANDI/F 30.

The NAND flash 10 is configured with a multi-chip package 15. The multi-chip package 15 is configured including a plurality of memory chips (for example, #0 to #3). Each of the memory chips includes a memory cell array in which a plurality of memory cells are arranged in a matrix. Each of the memory cells is capable of multi-level storage. Each of the memory chips is configured including an array of physical blocks, each of which is a unit of data erasure. The NAND flash 10 has data written and read for each physical page. The physical block is configured including a plurality of physical pages.

The controller 20 receives an instruction from the host 1 and controls the NAND flash 10 on the basis of the instruction received. Specifically, the controller 20 writes data instructed to be written by the host 1 to the NAND flash 10, and reads data instructed to be read by the host 1 from the NAND flash 10 and transmits the data to the host 1. The controller 20 is electrically connected to the NAND flash 10 via the NAND I/F 30. The NAND flash 10 stores data in a nonvolatile manner.

The NAND I/F 30 transmits and receives via separate wires for each of a chip enable signal (hereinafter referred to as /CE), a command latch enable signal (hereinafter referred to as CLE), an address latch enable signal (hereinafter referred to as ALE), a write enable signal (hereinafter referred to as /WE), a read enable signal (hereinafter referred to as /RE), a write protect, signal (hereinafter referred to as /WP), I/O<7:0>, and a data strobe signal (hereinafter referred to as DQS), for example.

(Example of Internal Configuration of Multi-Chip Package)

An example of an internal configuration of the multi-chip package 15 that configures the NAND flash 10 according to the embodiment is described.

Figure 2:
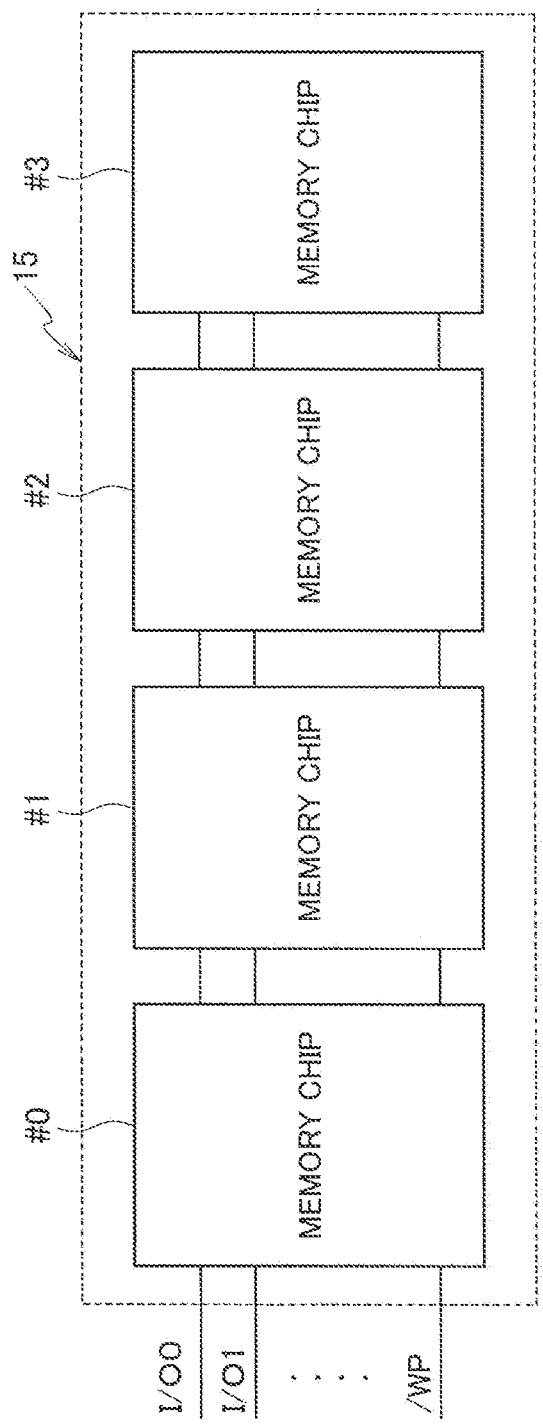
FIG. 2 is a block diagram illustrating an example of an internal configuration of a memory package according to the embodiment.

An example of the internal configuration of the multi-chip package 15 that configures the NAND flash 10 according to the embodiment is represented as illustrated in FIG. 2. In the present embodiment, the NAND flash 10 in FIG. 1 is configured including, for example, one multi-chip package 15. The NAND flash 10 may be configured including a plurality of multi-chip packages 15.

As illustrated in FIG. 2, the multi-chip package 15 includes a plurality of (here, four) memory chips #0 to #3.

Memory chips #0 to #3 are electrically connected by separate internal wires for each of /CE, CLE, ALE, /WE, /RE, /WP, I/O<7:0>, and DQS, for example. For example, I/O0 of the multi-chip package 15 is commonly connected to the memory chips #0 to #3 in the multi-chip package 15. Similarly, I/O1 of the multi-chip package 15 is commonly connected to the memory chips #0 to #3 in the multi-chip package 15. The same applies to other signals.

(Example of Internal Circuit of Memory Chip)

Next, an example of an internal circuit of the memory chips #0 to #3 is described.

Figure 3:
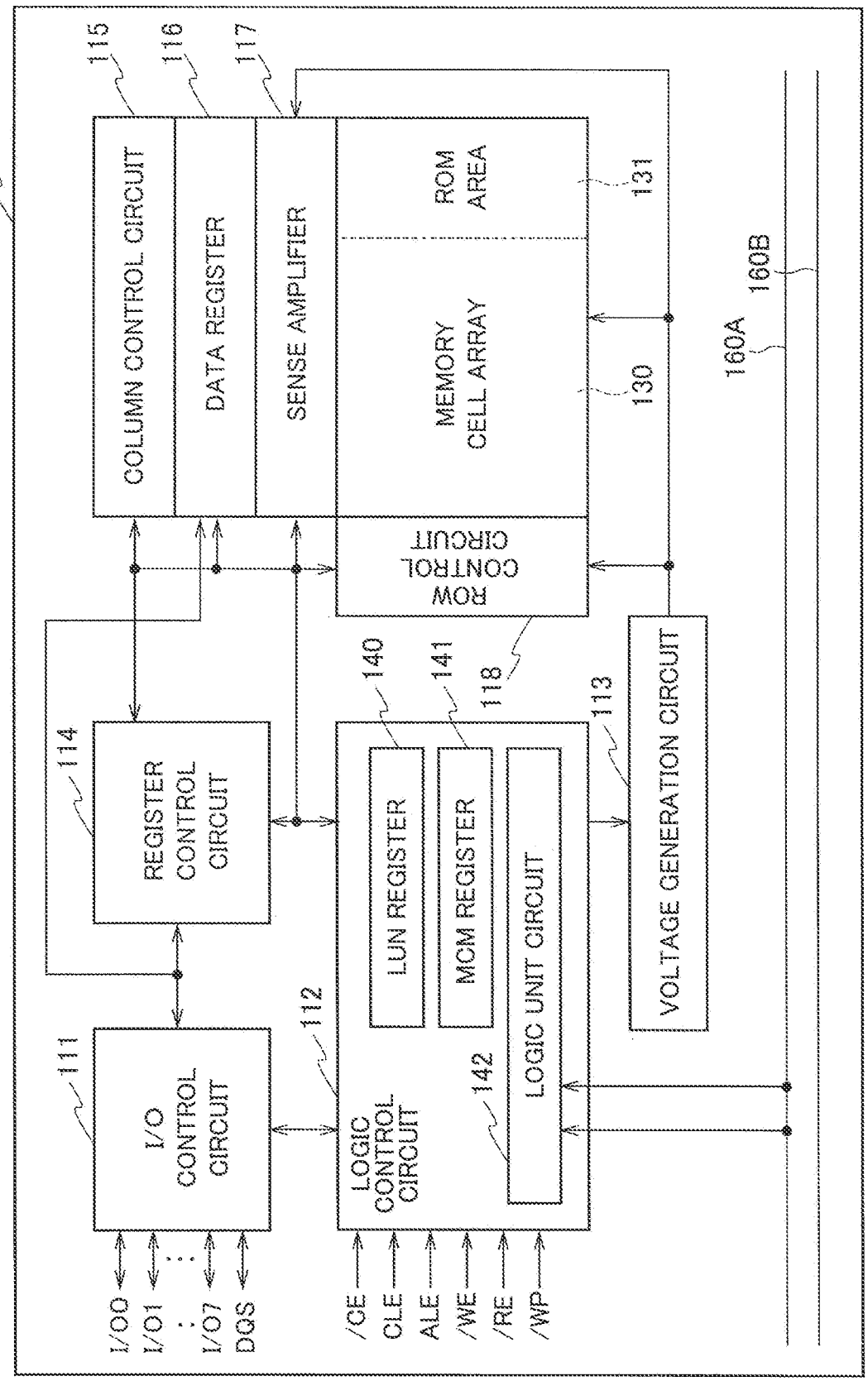
FIG. 3 is a block diagram illustrating an example of a circuit configuration of a memory chip according to the embodiment.

An example of an internal circuit of the memory chips #0 to #3 is represented as illustrated in FIG. 3. Each of the memory chips #0 to #3 has the same configuration, and the configuration of the memory chip #0 is described below.

As illustrated in FIG. 3, the memory chip #0 includes an I/O control circuit 111, a logic control circuit 112, a voltage generation circuit 113, a register control circuit 114, a column control circuit 115, a data register 116, a sense amplifier 117, a row control circuit 118, a memory cell array 130, a ROM area 131, and a plurality of internal wiring pads 160 (here, 160A, 160B). Note that the internal wiring pads 160 are an example of wiring pads.

The I/O control circuit 111 is a buffer circuit for transmitting and receiving I/O signals to and from the controller 20 via connection wiring of input pins (I/O0 to I/O7) for I/O signals. The I/O control circuit 111 sorts and stores a command, an address, and data (write data), which are taken in as I/O signals via I/O signals I/O0 to I/O7, to the register control circuit 114 or the data register 116 on the basis of a signal received by the logic control circuit 112.

The logic control circuit 112 receives input of various control signals via input pins (CE, ALE, etc.) for the various control signals. The logic control circuit 112 includes a state transition circuit (state machine), which makes a state transition on the basis of the control signal received, and controls the operation of the entire memory chip #0.

As illustrated in FIG. 3, the logic control circuit 112 includes a LUN register 140, an MCM register 141, and a logic unit circuit 142. Note that the logic unit circuit 142 includes an encoder circuit, and a comparator circuit. Details are described later.

The LUN register 140 is a register for storing LUN information. The LUN information is n-bit information (n is an integer of 2 or more) for identifying each memory chip. Specifically, when four memory chips are loaded in the multi-chip package 15, the logic unit circuit 142 numbers and identifies the LUN in "00" to "11", for example. Specifically, when a memory chip is "LUN=00", it is known as the "memory chip #0" that is the leading memory chip. Similarly, when a memory chip is "LUN=01", it is known as the "memory chip #1" that is the second memory chip. When a memory chip is "LUN=11", it is known as the "memory chip #3" that is the last memory chip. That is, the LUN information indicates what number and which chip should be accessed to access a certain block. For example, when a memory chip has a structure of 0 to 999 blocks, the memory chip #0 is from block 0 to 939, the memory chip #1 is from block 1000 to 1399, and the memory chip #3 is from block 3000 to 3999. When block 1200 is to be accessed, the LUN information of LUN=01 enables the selection of block 1200 in the second memory chip #1.

The MCM register 141 is a register for storing MCM information. The MCM information is information on the total number of memory chips loaded in the multi-chip package 15. The MCM information is n-bit information (n is an integer of 2 or more). Specifically, when four memory chips are leaded in the multi-chip package 15, the MCM information is MCM=11.

The logic unit circuit 142 reads electric signals via a plurality of internal wiring pads 160 (here, 160A or 160B). Note that the logic unit circuit 142 may include, for example, a plurality of physical bonding pads PD (here, PD1 to PD2) for reading potentials. In the following description, the physical bonding pads PD are referred to as bonding pads PD.

The bonding pads PD (here, PD1, PD2) of each of the memory chips #0 to #3 are supplied with potentials from the internal wiring pads 160 (here, 160A, 160B) to form a unique combination among the memory chips, for example. That is, the bonding pads PD may be connected to the internal wiring pads 160 to form a unique combination among the memory chips to supply potentials.

The logic unit circuit 142 functions so that each memory chip sets the LUN by a combination of potentials read from the internal wiring pad 160A and/or 160B via the bonding pads PD1 and PD2. Note that the bonding pads PD may be provided for n bits (n is an integer of 2 or more) according to the number N of memory chips to be loaded in the multi-chip package 15. For example, when there are eight memory chips, the number of bonding pads PD for three bits for identifying the memory chips is three. That is, the number of bonding pads PD may be three; however, it is not limited to these examples in practice.

Each of the internal wiring pads 160A, 160B is electrically connected to one of a power supply potential Vcc or a ground potential GND, for example. In FIG. 3, the internal wiring pad 160A is to the ground potential GND, and the internal wiring pad 160E is to the power supply potential Vcc. The bonding pads PD1, PD2 of the memory chip #0 are electrically connected commonly to the internal wiring pad 160A. Note that in the case of the memory chip #1, the bonding pad PD1 is electrically connected to the internal wiring pad 160B, and the bonding pad PD2 is electrically connected commonly to the internal wiring pad 160A, for example. In the following description, an "H" level when the power supply potential Vcc is connected is set to "1", and an "L" level when the ground potential GND is connected is set to "0". In the following description, the "H" level is referred to as "1", and the "L" level is referred to as "0".

The logic control circuit 112 instructs the voltage generation circuit 113 of a voltage value to be generated and power supply timing. The voltage generation circuit 113 supplies power to the memory cell array 130 and its peripheral circuits under the control, of the logic control circuit 112. The register control circuit 114 stores status information indicating whether writing to the memory cell array 130 is successful, status information indicating whether erasing from the memory cell array 130 is successful, and the like. The status information is transmitted to the controller 20 by the I/O control circuit 111 as a response signal.

The register control circuit 114 stores a command, an address, and status information. The register control circuit 114 transfers the address to the row control circuit 118 and the sense amplifier 117 and transfers the command to the logic control circuit 112.

The column control circuit 115, the sense amplifier 117, and the row control circuit 118 execute an access to the memory cell array 130 under the control of the logic control circuit 112.

The column control circuit 115 selects and activates a bit line corresponding to a column address. The row control circuit 116 selects a word line corresponding to a row address and activates the word line selected. The sense amplifier 117 applies a voltage to the bit line selected by the column control circuit 115 and writes data stored in the data register 116 to a memory cell transistor located at an intersection of the word line selected by the row control circuit 118 and the bit line selected by the column control circuit 115. The sense amplifier 117 reads data via the word line selected by the row control circuit 118 and the bit line selected by the column control circuit 115 and stores the data read in the data register 116. The data stored in the data register 116 is transmitted to the I/O control circuit 111 via a data line and is transferred from the I/O control circuit 111 to the controller 20.

The memory cell array 130 is configured including an array of NAND type memory cells and stores write data from the host 1.

The memory cell array 130 may be configured to have a ROM area 131 to store management information of the semiconductor integrated circuit 100. The ROM area 131 is a part of the memory cell array 130 and is configured including NAND type memory cells as in the memory cell array 130. The ROM area 131 can be rewritten by the manufacturer of the memory chip #0 or the manufacturer of the semiconductor integrated circuit 100 but cannot be accessed (read, write, erase) by the user of the semiconductor integrated circuit 100, for example. The ROM area 131 stores various kinds of management information.

As described above, according to the embodiment, each of the memory chips #0 to #3 includes the internal wiring pads 160. The logic unit circuit 142 detects potentials read from the internal wiring pads 160 (160A, 160B) to set the LUN. Further, the logic unit circuit 142 calculates the MCM information, which is the total number of chips loaded in the multi-chip package 15, on the basis of the LUN information of the respective memory chips #0 to #3. The logic unit circuit 142 determines the MCM information and thus determines the total capacity of the semiconductor integrated circuit 100. An operation method for setting the LUN and MCM of the memory chip is described later.

(Example of Initialization Operation)

Next, initialization operation of each memory chip when the power is turned on is described. When the power is turned on, each memory chip reads potentials from the plurality of bending pads PD provided in the logic unit circuit 142, for example. The logic unit circuit 142 initializes the LUN register 140.

Figure 4:
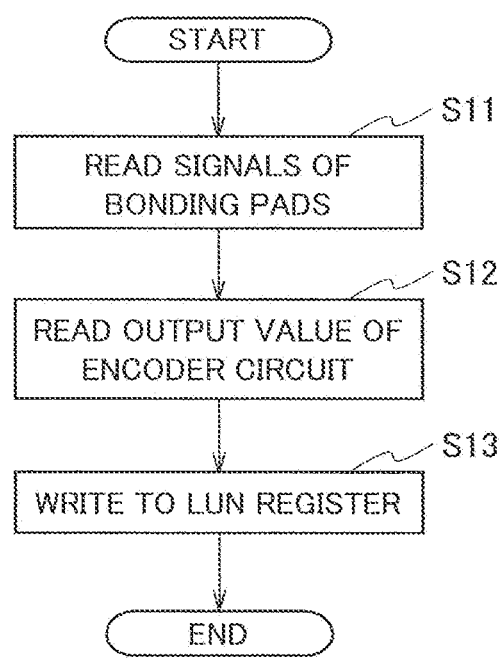

An example of the initialization operation is represented as illustrated in FIG. 4. An example of a table of read values of each memory chip by connection of the bonding pads PD (PD1, PD2) and the internal wiring pads 160 is represented as illustrated in FIG. 5. An example of a table of output values by the encoder circuit provided in the logic unit circuit 142 is illustrated in FIG. 6.

In step S11, the logic unit circuit 142 detects potentials from the bonding pads PD and reads electric signals of "1" or "0". Specifically, each of the memory chips reads electric signals from the bonding pads PD1, PD2, for example, as illustrated in FIG. 5.

In step S12, the logic unit circuit 142 reads an output value output from the encoder circuit, as illustrated in FIG. 6. Specifically, the logic unit circuit 142 inputs, for example, "0", which is an initial count, and reads "000" output from the encoder circuit. After reading, the logic unit circuit 142 adds one to a count value to set the count value to "1".

In step S13, the logic unit circuit 142 sets the output value of the encoder circuit as an initial value in the LUN register 140. Specifically, the logic unit circuit 142 writes "000" output by the encoder circuit as an initial count to the LUN register 140. Note that, for example, 2 bits of information "00" may be written in the LUN register 140.

As described above, according to the embodiment, the logic unit circuit 142 reads electric signals from the plurality of (here, two) bonding pads PD1, PD2 in the initialization operation when the power is turned on. Further, the logic unit circuit 142 writes the output value output from the encoder circuit to the LUN register 140.

(Example of Operation for Setting LUN and MCM)

Next, an operation of setting LUN and MCM is described. After the initialization operation when the power is turned on, the respective memory chips are separately described as a master chip MC and slave chips SC.

The master chip MC is, for example, the first memory chip #0 of the memory chips in the multi-chip package 15 illustrated in FIG. 2. The slave chips SC are, for example, the memory chips #1 to #3 other than the first memory chip #0 in the multi-chip package 15 illustrated in FIG. 2. The memory chips in the multi-chip package 15 each recognize the LUN and MCM by each memory chip #0 to #3, and the master chip MC mainly performs the setting operation of the LUN and MCM.

As illustrated in FIG. 2, the master chip MC and the slave chips SC are commonly connected to the I/O signal. The master chip MC can exchange signals with the slave chips SC via the I/O signal, for example.

An example of the operation of the master chip MC is represented as illustrated in FIG. 7A. An example of the operation of the slave chips SC is represented as illustrated in FIG. 7B.

In the operation of setting the LUN and MCM when the power is turned on, the logic unit circuit 142 selects the master chip MC and the slave chips SC on the basis of signals read from the bonding pads PD1 and PD2. A memory chip selected as the master chip MC transmits pulse counts to the slave chips SC, and each of the slave chips SC sets the LUN. The master chip MC receives status signals for status response commands from the slave chips SC and sets the MCM. The following is an example of a detailed flow of an operation for setting the LUN and MCM when the power is turned on.

In step S21, each of the memory chips reads potentials from the bonding pads FD in the initialization (S11 to S13) when the power supply is turned on. Each memory chip has the LUN initialized and stores LUN information in the LUN register 140.

In step S22, the logic unit circuit 142 determines whether a value stored in the LUN register 140 matches a value "00" of electric signals read from the bonding pads. A logic unit circuit 142 whose value stored matches "00" proceeds the process to step S23. A logic unit circuit 142 whose value stored does not match "00" proceeds the process to step S31. That, is, step S23 onward is the operation of the master chip MC. Step S31 onward is the operation of the slave chips SC.

(Master Chip Operation)

In step S23, the logic unit circuit 142 transmits a pulse count to the slave chips SC. Specifically, the logic unit circuit 142 inputs a count value "1" to the encoder circuit, for example, and outputs an output value "001" output from the encoder circuit to the slave chips SC as a pulse count. That is, to recognize the slave chips SC, the logic unit circuit 142 uses the encoder circuit to transmit the pulse count for the count value. The pulse count is used by the master chip MC and the slave chips SC to recognize the LUN of respective memory chips. In the following description, the pulse count is also referred to as a pulse waveform, or a pulse clock number.

In step 324, after a slave chip SC stores the pulse count received, the logic unit circuit 142 transmits a status response command to the slave chips SC. Specifically, the logic unit circuit 142 transmits, for example, a pulse count "001" and requests a response from a slave chip SC, which is the memory chip #1.

In step S25, the logic unit circuit 142 determines whether a status response from the slave chip SC is received. When receiving the status response from the slave chip SC, the logic unit circuit 142 proceeds the process to step S26. When not receiving the status response from the slave chip SC, the logic: unit circuit 142 proceeds the process to step S27. The status response means that when a slave chip SC is present, the slave chip SC transmits status information of a signal of "H" level to the master chip MC, for example.

In step S26, the logic unit circuit 142 adds one to the counter. Specifically, the logic unit circuit 142 adds one to the count value of the counter. For example, when the count value is "1", the count value is increased to "2".

In step S27, the logic unit circuit 142 determines whether the status response, which is status information transmitted by a slave chip SC, has been received up to a specified number of times (here, seven times). Specifically, when having received the status response, which is status information transmitted by a slave chip, for the specified number of times (here, seven times), the logic unit circuit 142 proceeds the process to step S28. When having not received the status response, which is status information transmitted by a slave chip, up to the specified number of times (here, seven times), the logic unit circuit 142 returns the process to step S23. The specified number of times is a number of pulse count occurrences for recognizing the LUN of the slave chips SC. That is, if there is the status response up to the memory chip #3 and no status response after a memory chip #4, it is determined that there are four memory chips loaded in the multi-chip package 15. That is, the logic unit circuit 142 determines the total number of memory chips loaded on the basis of the status information from the slave chips SC.

In step S28, the logic unit circuit 142 sets the determined total number of memory chips loaded in the MCM register 141. The logic unit circuit 142 may transmit a command for setting the MCM register 141 to the slave chips SC via the I/O signal.

(Slave Chip Operation)

In step S31, when the pulse count received matches the value of electric signals read from the bonding pads, a logic unit circuit 142 proceeds the process to step S32. When the pulse count received does not match the value of electric signals read from the bonding pads, the logic unit circuit 142 proceeds the process to step S34. Specifically, the logic unit circuit 142 receives the pulse count transmitted by the master chip MC. Further, the logic unit circuit 142 compares the pulse count received with the value of electric signals read from the bonding pads using a comparator circuit. Further, the logic unit circuit 142 counts the number of times of pulse count reception.

In step S32, the logic unit circuit 142 stores the pulse count transmitted by the master chip MC and overwrites the LUN information from the initial value. That is, when the pulse count received matches the value of electric signals read from the bonding pads PD, the logic unit circuit 142 writes the pulse count to the LUN register 140 and sets the LUN information. Specifically, the memory chip #1 that is the slave chip, for example, receives a pulse count, and when the pulse count matches the value of electric signals read from the bonding pads PD, writes the pulse count to the LUN register 140 and sets the LUN information. Note that, when the value of electric signals read from the bonding pads PD is 2-bit information, it may be compared with up to 2-bit information of the pulse count.

In step S33, the logic unit circuit 142 receives a status response command transmitted by the master chip MC. The logic unit circuit 142 transmits status information to the master chip MC via the I/O signal on the basis of the pulse count received by each of the slave chips SC. Note that the logic unit circuit 142 transmits the status information to the master chip MC after receiving the status response command for the pulse count.

In step S34, the logic unit circuit 142 determines whether the number of times of pulse count reception has reached the specified number. Specifically, when the number of times of pulse count reception reaches the specified number, the logic unit circuit 142 proceeds the process to step S35. When the number of times of pulse count reception has not reached to the specified number, the logic unit circuit 142 returns the process to step 331.

In step S35, the logic unit circuit 142 sets the MCM register 141. The status response operation between the master chip MC and the slave chips SC is described later using an operation example of a timing chart.

(Example of Operation of Response Determination Between Master Chip MC and Slave Chips SC)

Next, the response operation between the master chip and the slave chips when the LUN and MCM are set is described with reference to timing charts.

Figure 8B:
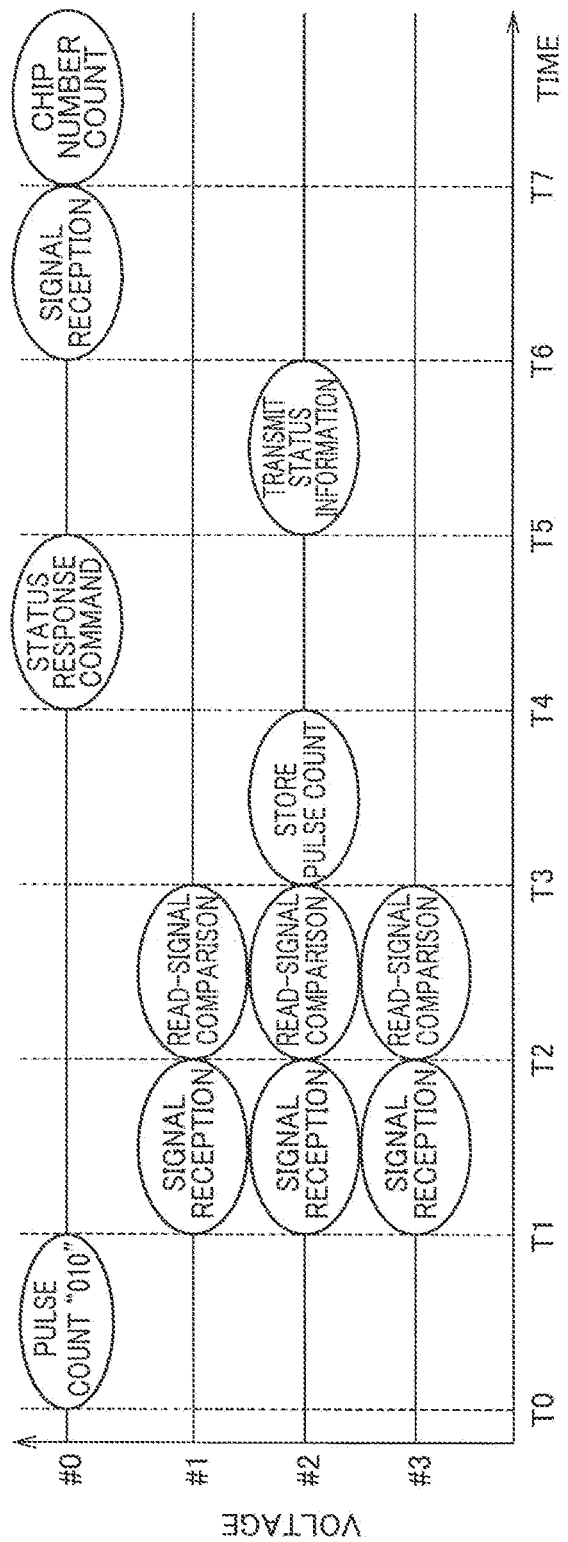
FIG. 8B is a timing chart diagram illustrating a response sequence with a pulse count "010" and a status response command.
Figure 8C:
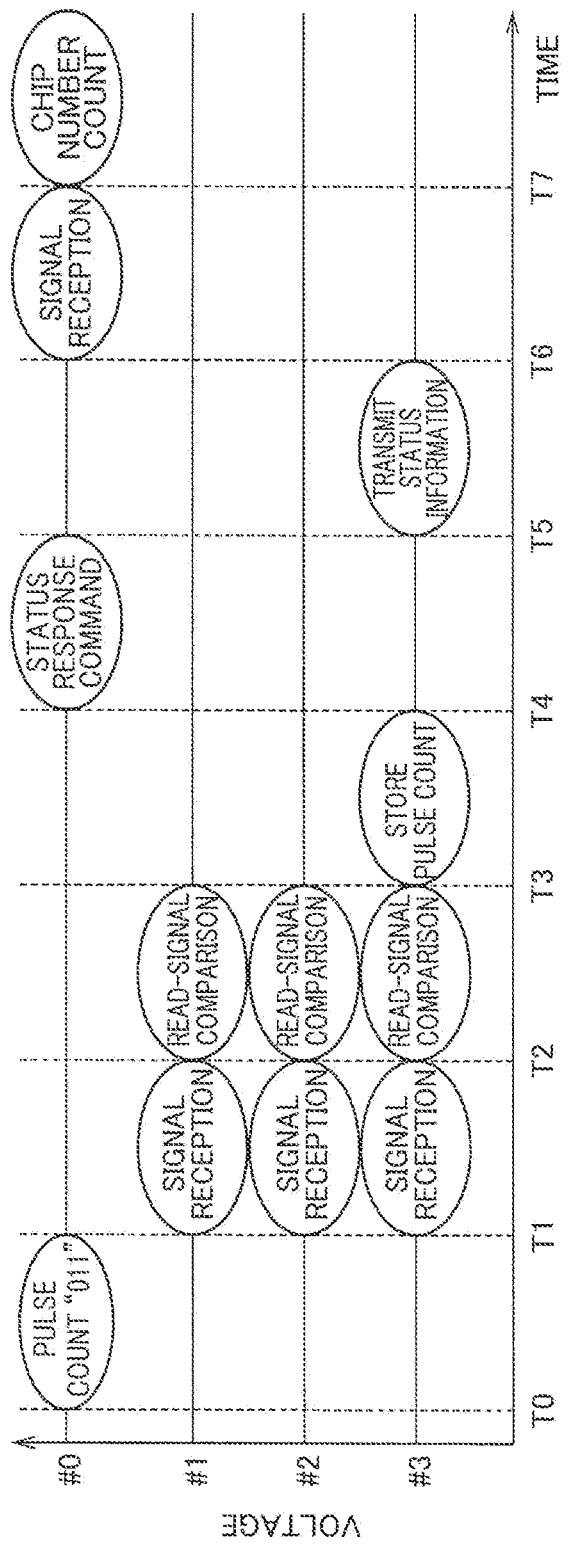
FIG. 8C is a timing chart diagram illustrating a response sequence with a pulse count "011" and a status response command.

FIG. 8A illustrates an example of a timing chart of the response operation between the master chip MC and the slave chips SC when the master chip MC transmits a pulse count "001" having a pulse waveform. Similarly, FIG. 8B illustrates an example of a timing chart when the master chip MC transmits a pulse count "010" having a pulse waveform. FIG. 8C illustrates an example of a timing chart when the master chip MC transmits a pulse count "011" having a pulse waveform. FIG. 8D illustrates an example of a timing chart when the master chip MC transmits a pulse count "100" having a pulse waveform. Note that, cases where the master chip MC transmits pulse counts "101" to "111", which are pulse waveforms, are omitted.

(Case of Transmitting Pulse Count "001")

As illustrated in FIG. 8A, during a period from T0 to T1, the master chip MC transmits a pulse count "001" to the slave chips SC.

During a period from T1 to T2, the memory chips #1 to #3 that are the slave chips SC each receive the pulse count transmitted from the master chip MC.

During a period from T2 to T3, the memory chips #1 to #3 that are the slave chips SC each compare the pulse count received with a signal read to see if they match.

During a period from T3 to T4, the memory chip #1 whose pulse count received matches the signal read stores the pulse count. Specifically, the memory chip #1, for example, overwrites LUN information and sets it in the LUN register 140. The memory chips #2 and #3 whose pulse counts received do not match signals read confirm whether the pulse count reception has reached a prescribed number of times.

During a period from T4 to T5, the master chip MC transmits a status response command.

During a period from 75 to T6, the memory chip #1 that is the slave chip SC transmits status information to the master chip MC.

During a period from T6 to T7, the master chip MC receives status information from the slave chip SC.

After T7, since having received the status, information, the master chip MC cumulatively counts the chip loaded in the multi-chip package 15.

(Case of Transmitting Pulse Count "010")

As illustrated in FIG. 8B, during a period from T0 to T1, the master chip MC transmits a pulse count "010" to the slave chips SC.

During a period from T1 to T2, the memory chips #1 to #3 that are the slave chips SC each receive the pulse count transmitted from the master chip MC.

During a period from T2 to T3, the memory chips #1 to #3 that are the slave chips SC each compare the pulse count received with a signal read to see if they match.

During a period from T3 to T4, the memory chip #2 whose pulse count received matches the signal read stores the pulse count. Specifically, the memory chip #2, for example, overwrites LON information and sets it in the LUN register 140. The memory chips #1 and #3 whose pulse counts received do not match signals read confirm whether the pulse count reception has reached the prescribed number of times.

During a period from T5 to T6, the memory chip #2 that is the slave chip SC transmits status information to the master chip MC.

During a period from T6 to T7, the master chip MC receives status information from the slave chip SC.

After T7, since having received the status information, the master chip MC cumulatively counts the chip loaded in the multi-chip package 15.

(Case of Transmitting Pulse Count "011")

As illustrated in FIG. 8C, during a period from T0 to T1, the master chip MC transmits a pulse count "011" to the slave chips SC.

During a period T1 to T2, the memory chips #1 to #3 that are the slave chips SC each receive the pulse count transmitted from the master chip MC.

During a period from T2 to T3, the memory chips #1 to #3 that are the slave chips SC each compare the pulse count received with a signal read to see if they match.

During a period from T3 to T4, the memory chip #3 whose pulse count received matches the signal read stores the pulse count. Specifically, the memory chip #3, for example, overwrites LUN information and sets it in the LUN register 140. The memory chips #1 and #2 whose pulse counts received do not match signals read confirm whether the pulse count reception has reached the prescribed number of times.

During a period from T5 to T6, the memory chip #3 that is the slave chip SC transmits status information to the master chip MC.

During a period from T6 to T7, the master chip MC receives status information from the slave chip SC.

After T7, since having received the status information, the master chip MC cumulatively counts the chip loaded in the multi-chip package 15.

(Case of Transmitting Pulse Count "100")

As illustrated in FIG. 8D, during a period from T0 to T1, the master chip MC transmits a pulse count "100" to the slave chips SC.

During a period from T1 to T2, the memory chips #1 to #3 that are the slave chips SC each receive the pulse count transmitted from the master chip MC.

During a period from T2 to T3, the memory chips #1 to #3 that are the slave chips SC each compare the pulse count received with a signal read to see if they match.

During a period from T3 to T4, the memory chips #1, #2 and #3 whose pulse counts received do not match signals read confirm whether the pulse count reception has reached the prescribed number of times.

During a period from T5 to T6, the slave chips SC do not transmit status information due to no matching in all of them.

During a period from T6 to T7, since receiving no status information from any slave chip SC, the master chip MC determines that there is no memory chip #4.

After 77, since receiving no status information, the master chip MC determines the total number of chips loaded in the multi-chip package 15. Note that in one example of this timing chart, the total number of chips loaded is determined when there is no status information from any slave chip SC. However, as described above, the total number of chips loaded may be determined after the status information from a slave chip SC is confirmed up to the specified number of times, seven times, for example.

As described above, according to the embodiment, the roaster chip MC transmits a pulse count to slave chips SC. Each of the slave chips SC compares the pulse count from the master chip MC with electric signals read from the bonding pads and sets it in the LUN register when they match. The master chip MC transmits a status response command to the slave chips SC, and a slave chip SC transmits status information to the master chip MC. The master chip MC accumulates the MCM on the basis of the status information from the slave chips SC to determine the MCM. The master chip MC sets the MCM determined in the MCM register 141. Not that, in the semiconductor integrated circuit 100, since each of the memory chips recognizes the LUN information on the basis of potentials read from the bonding pads PD, the master chip MC may determine the total number of loaded chips by transmitting a status response command to the slave chips SC from the beginning without transmitting a pulse count to the slave chips SC.

Effect of Embodiment

According to the embodiment, the logic unit circuit 142 can automatically set the LUN by reading potentials from the bonding pads PD of each of the memory chips when the power is turned on. Further, the logic unit circuit 142 can calculate the total number MCM of memory chips loaded in the multi-chip package 15 on the basis of each LUN information of the memory chips. Further, the logic unit circuit 142 can determine the total capacity in the multi-chip package 15 on the basis of the total number MCM of memory chips loaded in the multi-chip package 15.

Modified Example of Embodiment (Example of Internal Configuration of Multi-Chip Package)

An example of an internal configuration of a multi-chip package 15A that configures the NAND flash 10 according to a modification of the embodiment is described.

An example of the internal configuration of the multi-chip package 15A that configures the NAND flash 10 according to the modification of the embodiment is represented as illustrated in FIG. 9. As illustrated in FIG. 3, the multi-chip package 15 according to the present embodiment is configured to connect potentials to form unique combinations by connecting the internal wiring pads 160 in each of the memory chips and the physical bonding pads PD of the logic unit circuit 142 in each of the memory chips. In contrast to the configuration of the multi-chip package 15 according to the present embodiment, the multi-chip package 15A according to the modification of the embodiment includes a plurality of external wiring pads 170 in the multi-chip package 15A. That is, as illustrated in FIG. 9, the multi-chip package 15A is configured to connect potentials to form unique combinations by connecting the external wiring pads 170A, 1703 in the multi-chip package 15A and the bonding pads PD of the logic unit circuit 142 in each of the memory chips. Note that the multi-chip package 15A is configured similarly as the multi-chip package 15 according to the present embodiment for the other components. Note that the external wiring pads 170 are an example of wiring pads.

Each of the external wiring pads 170A, 1703 is electrically connected to one of the power supply potential Vcc or the ground potential GND, for example. In FIG. 9, the external wiring pad 170A is to the ground potential GND. The external wiring pad 170B is to the power supply potential Vcc. A memory chip #0A has bonding pads PD1, PD2 electrically connected commonly to the external wiring pad 170A. A memory chip #1A has the bonding pad PD1 electrically connected to the external wiring pad 170A, and the bonding pad PD2 electrically connected to the external wiring pad 170B. A memory chip #2A has the bonding pad PD1 electrically connected to the external wiring pad 170B, and the bonding pad PD2 electrically connected to the external wiring pad 170A. A memory chip #3A has the bonding pads PD1, PD2 electrically connected commonly to the external wiring pad 170B.

(Examples of Internal Circuit of Memory Chip)

Next, an example of an internal circuit of the memory chips #0A to #3A according to the modification of the embodiment is described.

Figure 10:
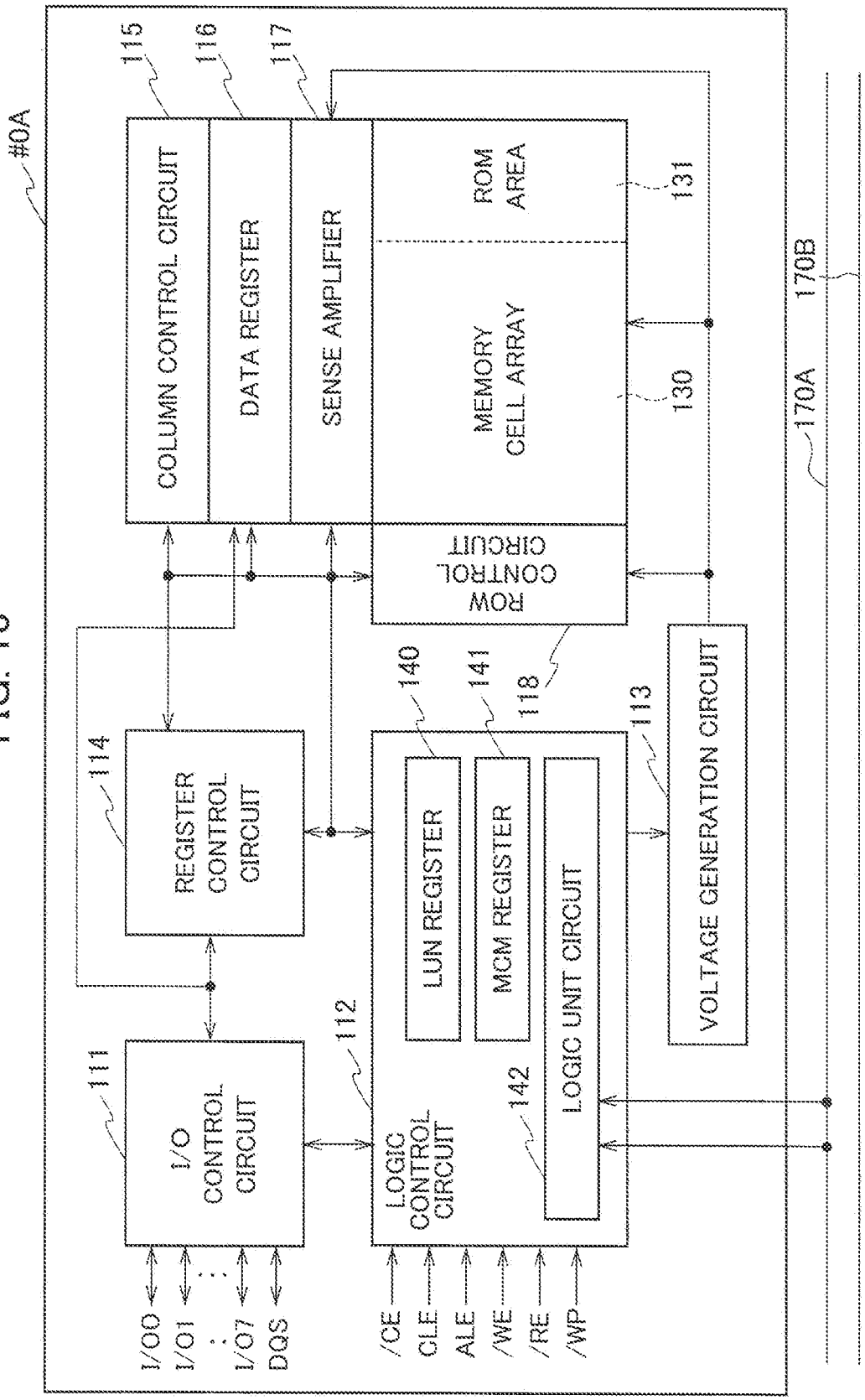
FIG. 10 is a block diagram illustrating an example of a circuit configuration of a memory chip according to the modification of the embodiment.

An example of the internal circuit of the memory chips #0A to #3A is represented as illustrated in FIG. 10. Since each of the memory chips #0A to #3A has the same configuration, the configuration of the memory chip #0A is described here.

The configuration of the internal circuit of the memory chip #0A differs from that of the memory chip #0 in reading potentials for determining the setting of LUN from the external wiring pads 170 outside each of the memory chips. Note that the basic operation of the multi-chip package 15A is the same as that of the multi-chip package 15.

(Example of Sectional and Plan Views of Internal Configuration of Multi-Chip Package 15A)

Figure 11:
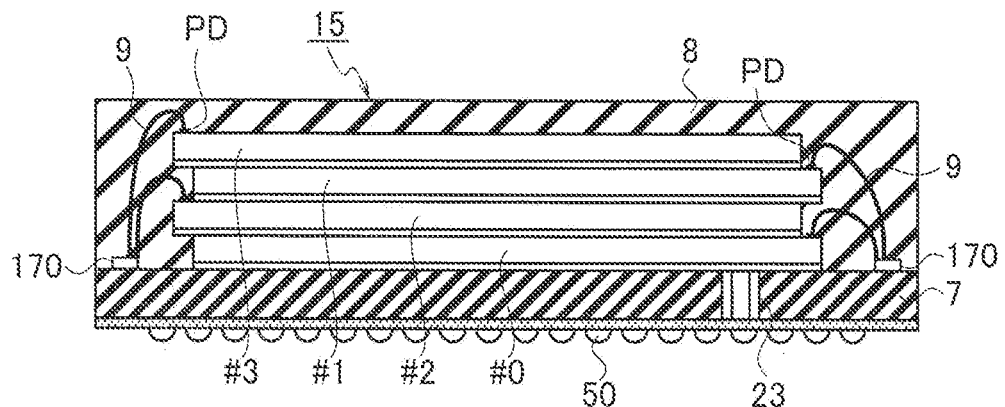
FIG. 11 is a sectional view illustrating an example of a mounting structure of a memory package according to the modification of the embodiment.
Figure 12:
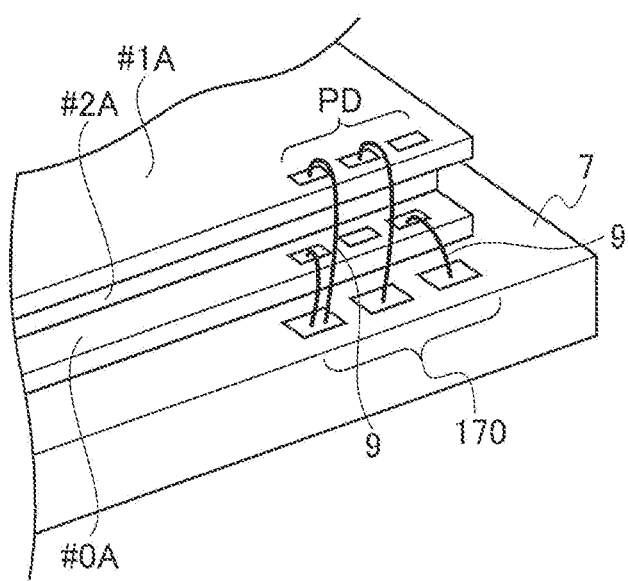
FIG. 12 is a perspective view illustrating an example of a mounting structure of the memory package according to the modification of the embodiment.
Figure 13:
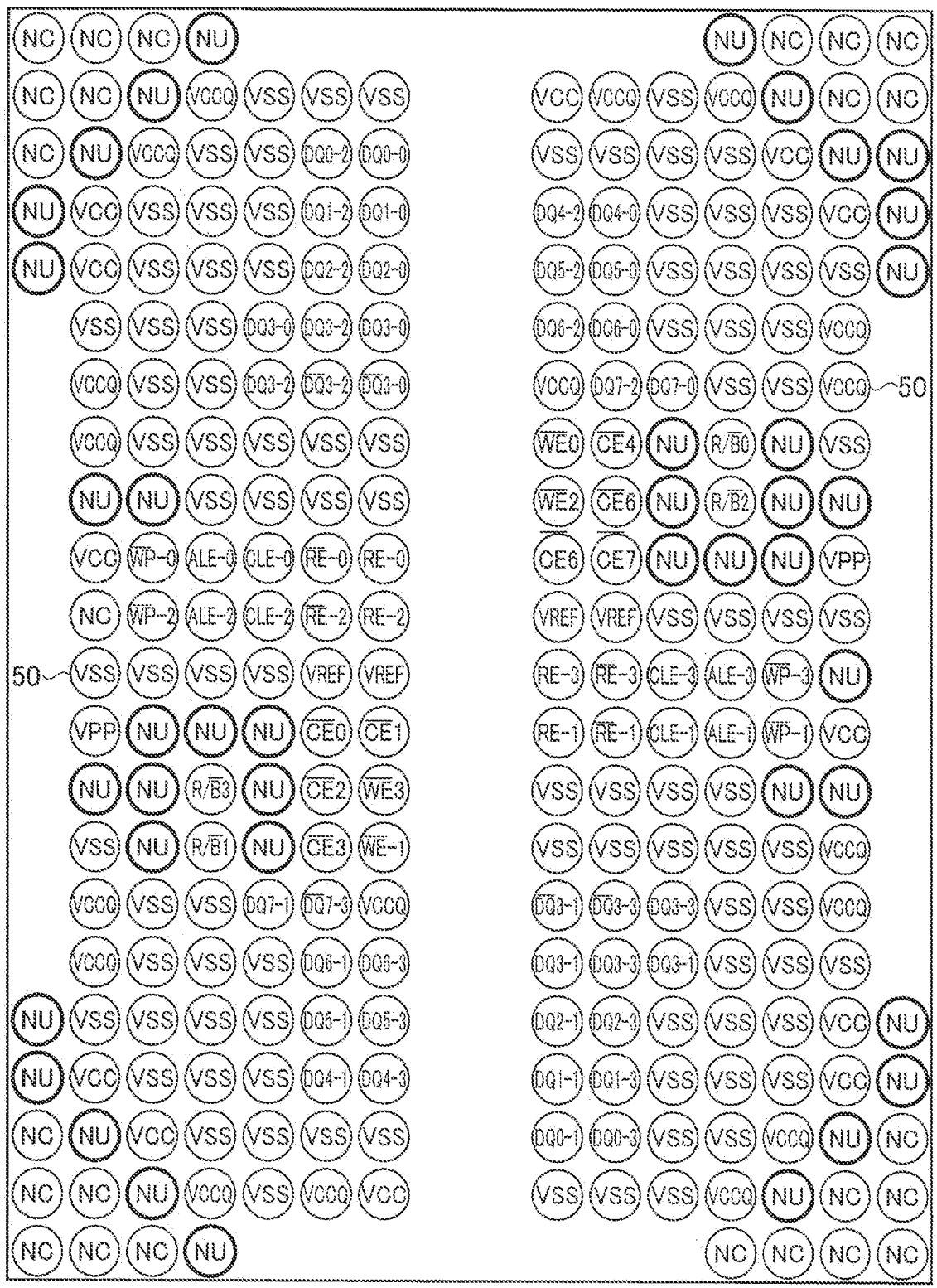
FIG. 13 is a plan view illustrating an arrangement example of solder balls of the memory package according to the modification of the embodiment.

FIG. 11 is an example of a sectional view of an example of the internal configuration of the multi-chip package 15A illustrated in FIG. 9. FIG. 12 is an example of a perspective view of an example of an internal configuration of a part of the multi-chip package 15A. FIG. 13 is an example of a plan view of the back of the multi-chip package 15A.

As illustrated in FIG. 11, the multi-chip package 15A according to the modification of the embodiment is configured including a wiring substrate 7, four memory chips #0A to #3A stacked on the wiring substrate 7, bonding wires 9, a resin sealing body 3 for resin-sealing the memory chips #0A to #3A and the bonding wires 9, and solder balls 50 formed in a grid-like arrangement on the back of the wiring substrate 7.

As illustrated in FIGS. 11 and 12, the bonding wires 9 electrically connect bonding pads PD provided on end parts of the respective memory chips #0 to #3 stacked and external wiring pads 170 provided on an end part of the wiring substrate 7. The bonding pads PD are pads for the logic unit circuit 142 of the memory chip to read potentials.

The external wiring pads 170 are electrically connected to some of the solder balls 50 by wiring patterns formed on the front and back of the wiring substrate 7. A pattern formed on the front and a wiring pattern formed on the back are connected by a through hole 23.

The solder balls 50 are input/output pins of the multi-chip package 15A. As illustrated in FIG. 13, the solder balls 50 include control signal pins, I/O signal pins, and the like among these input/output pins. In FIG. 13, Vcc represents a power supply potential pin, Vss represents a ground potential pin, NU represents an unused pin, and NC represents an unconnected pin. NU pins are indicated by circled lines. That is, the multi-chip package 15A uses NU pins of the solder balls 50 to uniquely connect the external wiring pads 170 to the bonding pads to connect potentials.

Effects of Modification of Embodiment

The multi-chip package 15A can set the LUN by electrically connecting the bonding pads PD of respective memory chips and the external wiring pads 170 when assembling the multi-chip package 15A for mounting the memory chips.

The multi-chip package 15A can set potentials to be read by the logic unit circuits 142 by using NU pins of the solder balls 50. With this setting of NU pins after the multi-chip package 15A is assembled, the LUN can be automatically set in the memory chips of the multi-chip package 15A when the power is turned on.

While certain embodiments have been described, these embodiments have been presented by way of examples only, and are not intended to limit the scope of the inventions. Indeed, these novel embodiments described herein may be embodied in a variety of other forms; furthermore, various omissions, substitutions, and changes may be made without departing from the spirit of the inventions. That is, for example, there are various types of circuit configurations in which LUN and MCM information is transmitted between the master chip MC and slaves SC, and these embodiments and variations thereof are included in the scope and the gist of the invention and are also included in the scope of the invention described in the claims and their equivalents.

What is claimed is:

1. A semiconductor integrated circuit comprising:
    a multi-chip package comprising a plurality of memory chips; and
    a controller configured to control the multi-chip package, wherein
    each of the plurality of memory chips comprises a logic control unit comprising a logic unit circuit configured to detect a potential from a wiring pad, and
    the logic unit circuit determines a master chip or a slave chip on the basis of the potential detected from the wiring pad, the master chip transmits a pulse count and a status response command to the slave chip, so that the slave chip sets a logical unit number of its own memory chip, and the master chip sets a total number of chips loaded on the basis of status information from the slave chip.

2. The semiconductor integrated circuit according to claim 1, wherein
    the wiring pad comprises an internal wiring pad in each of the plurality of memory chips.

3. The semiconductor integrated circuit according to claim 1, wherein
    the wiring pad comprises an external wiring pad outside each of the plurality of memory chips.

4. The semiconductor integrated circuit according to claim 1, wherein
    the logic unit circuit further comprises a physical bonding pad.

5. The semiconductor integrated circuit according to claim 1, wherein
    the logic control unit comprises a LUN register configured to store information on the logical unit number.

6. The semiconductor integrated circuit according to claim 1, wherein
    the logic control unit comprises an MCM register configured to store information on the total number of chips leaded of the plurality of memory chips loaded in the multi-chip package.

7. The semiconductor integrated circuit according to claim 1, wherein
    the logic unit circuit further comprises an encoder circuit, and
    the pulse count to be transmitted to the slave chip is output using a value output by the encoder circuit of the master chip.

8. The semiconductor integrated circuit according to claim 1, wherein
    the logic unit circuit further comprises a comparator circuit, and
    a signal of the potential detected from the wiring pad is compared with a signal of the pulse count transmitted from the master chip to the slave chip.

9. The semiconductor integrated circuit according to claim 1, wherein
    the multi-chip package comprises solder balls configured to input and output signals, and
    a potential to be read by the logic unit circuit is set by using an unused pin of the solder balls by a user.

10. A multi-chip package provided in a semiconductor integrated circuit, comprising:
    a plurality of memory chips, wherein
    each of the plurality of memory chips comprises a logic control unit comprising a logic unit circuit configured to detect a potential from a wiring pad, and
    the logic unit circuit determines a master chip or a slave chip on the basis of the potential detected from the wiring pad, the master chip transmits a pulse count and a status response command to the slave chip, so that the slave chip sets a logical unit number of its own memory chip, and the master chip sets a total number of chips loaded on the basis of status information from the slave chip.

11. The multi-chip package according to claim 10, wherein
    the wiring pad comprises an internal wiring pad in each of the plurality of memory chips.

12. The multi-chip package according to claim 10, wherein
    the wiring pad comprises an external wiring pad outside each of the plurality of memory chips.

13. The multi-chip package according to claim 10, wherein
    the logic unit circuit further comprises a physical bonding pad.

14. The multi-chip package according to claim 10, wherein
    the logic control unit comprises a LUN register configured to store information on the logical unit number.

15. The multi-chip package according to claim 10, wherein
    the logic control unit comprises an MCM register configured to store information on the total number of chips leaded of the plurality of memory chips loaded in the multi-chip package.

16. The multi-chip package according to claim 10, wherein
    the logic unit circuit further comprises an encoder circuit, and
    the pulse count to be transmitted to the slave chip is output using a value output by the encoder circuit of the master chip.

17. The multi-chip package according to claim 10, wherein
    the logic unit circuit further comprises a comparator circuit, and
    a signal of the potential detected from the wiring pad is compared with a signal of the pulse count, transmitted from the master chip to the slave chip.

18. An operation method of a semiconductor integrated circuit, the semiconductor integrated circuit comprising:
    a multi-chip package comprising a plurality of memory chips; and a controller configured to control the multi-chip package,
the operation method comprising:
detecting a potential from a wiring pad by a logic unit circuit provided in each of the plurality of memory chips;
determining a master chip or a slave chip on the basis of the potential detected from the wiring pad by the logic unit circuit provided in each of the plurality of memory chips;
transmitting a pulse count and a status response command by the master chip;
setting a logical unit number of the slave chip on the basis of the pulse count transmitted by the master chip;
transmitting status information by the slave chip; and
determining a total number of memory chips loaded in the multi-chip package by the master chip receiving the status information.

19. The operation method according to claim 18, wherein the potential detected from the wiring pad comprises identification information on each memory chip in the multichip package.

20. The operation method according to claim 18, wherein the potential is detected from the wiring pad when power is turned on.

* * * * *